United States Patent
Tshagharyan et al.

(10) Patent No.: US 12,002,530 B2
(45) Date of Patent: Jun. 4, 2024

(54) EMBEDDED MEMORY TRANSPARENT IN-SYSTEM BUILT-IN SELF-TEST

(71) Applicant: Synopsys, Inc., Mountain View, CA (US)

(72) Inventors: Grigor Tshagharyan, Yerevan (AM); Gurgen Harutyunyan, Yerevan (AM); Samvel Shoukourian, Yerevan (AM); Yervant Zorian, Santa Clara, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/977,599

(22) Filed: Oct. 31, 2022

(65) Prior Publication Data

US 2023/0140090 A1    May 4, 2023

Related U.S. Application Data

(60) Provisional application No. 63/274,127, filed on Nov. 1, 2021.

(51) Int. Cl.
*G11C 29/12*    (2006.01)

(52) U.S. Cl.
CPC .................................... *G11C 29/12* (2013.01)

(58) Field of Classification Search
CPC ......... G11C 29/12; G11C 29/10; G11C 29/26; G11C 29/16; G11C 29/34; G11C 2029/0401; G11C 2029/1202; G11C 2029/1804; G11C 29/52
USPC ........................................................ 714/718
See application file for complete search history.

(56) References Cited

U.S. PATENT DOCUMENTS

| | | | |
|---|---|---|---|
| 7,278,078 B2 * | 10/2007 | Hii ......................... | G01R 31/30 714/763 |
| 2005/0204231 A1 * | 9/2005 | Mukherjee ............. | G11C 29/16 714/733 |
| 2006/0218452 A1 * | 9/2006 | Njinda ............. | G11C 29/56012 714/718 |
| 2007/0168803 A1 * | 7/2007 | Wang ............... | G01R 31/31704 714/726 |
| 2010/0268999 A1 | 10/2010 | Morrison | |

(Continued)

OTHER PUBLICATIONS

International Search Report and Written Opinion, Internatinal Application No. PCT/US2022/048420, dated Feb. 24, 2023.

*Primary Examiner* — Shelly A Chase
*Assistant Examiner* — Enam Ahmed
(74) *Attorney, Agent, or Firm* — Patterson + Sheridan, LLP

(57) ABSTRACT

A memory transparent in-system built-in self-test may include performing in-system testing on subsets of memory cells over one or more test intervals of one or more test sessions. A test interval may include copying contents of a subset of memory cells to a register(s), writing test data (e.g., a segment of a pattern) to the subset of memory cells, reading back contents of the subset of memory cells, and restoring the content from the register(s) to the subset of memory cells. In-system testing may be performed on overlapping sets of memory cells. In-system testing may be performed on successive subsets of memory cells within a row (i.e., fast column addressing) and/or within a column (fast column addressing). In-system testing may be performed on sets of m blocks of memory cells during respective test intervals. The number of m blocks tested per interval may be configurable/selectable.

20 Claims, 10 Drawing Sheets

FIG. 3

(56) References Cited

U.S. PATENT DOCUMENTS

| | | | |
|---|---|---|---|
| 2012/0204069 A1* | 8/2012 | Hughes | G11C 29/16 714/E11.162 |
| 2014/0258780 A1* | 9/2014 | Eyres | G11C 29/4401 714/30 |
| 2015/0371718 A1 | 12/2015 | Becker et al. | |
| 2019/0102087 A1 | 4/2019 | Shi et al. | |
| 2023/0135977 A1* | 5/2023 | Kan | G06F 30/333 716/136 |

* cited by examiner

EMBEDDED MEMORY TRANSPARENT IN-SYSTEM BUILT-IN SELF-TEST

RELATED APPLICATION

The present application claims the benefit of U.S. Application for Provisional Patent No. 63/274,127, titled "Embedded Memory Transparent In-System Built-In Self-Test (BIST) Solution," filed Nov. 1, 2021, which is incorporated herein by reference in its entirety.

TECHNICAL FIELD

The present disclosure generally relates to embedded memory transparent built-in self-test techniques.

BACKGROUND

As the semiconductor industry continues its progression towards aggressive nanoscale technology nodes reduction, safety and reliability of individual devices and the entire system fabricated in advanced nodes are paid more attention. This becomes an important problem especially with the emergence of applications like automotive and Internet of Things deploying advanced safety and reliability metrics. Traditionally, manufacturing defects occurring in the production stage are considered to be the main source of faults for System-on-Chips (SoC). Nevertheless, for safety-critical applications, in-field faults detection becomes equally important. Recent studies have revealed that in-field faults mainly caused by process variation and aging phenomena, especially in sub-20 nanometer technology nodes, have a significant impact on SoC lifetime and increase the system's Failure in Time (FIT) rate. Meanwhile, keeping hold of low FIT rate and eventually Defects Part per Billion (DPPB) is one of the main criteria for safety and reliability assurance. Therefore, what is needed are techniques for detecting faults in the field.

SUMMARY

Disclosed herein are memory transparent in-system built-in self-test techniques.

An example is an integrated circuit (IC) device that includes a memory system comprising multiple memory cells, control circuitry configured to preclude functional circuitry from accessing the memory cells during test sessions, one or more registers, and memory built-in self-test (MBIST) circuitry configured to test subsets of the memory cells during the test sessions, including to store contents of the subsets of the memory cells in the one or more registers prior to testing the respective subsets of the memory cells, and restore the contents of the subsets of the memory cells from the one or more registers subsequent to testing the respective subsets of the memory cells.

The MBIST circuitry may test a first set of m blocks of memory cells during a first test interval of a first one of the test sessions and test a second set of m blocks of memory cells during a second test interval of the first test session, where each block includes one or more memory cells, and where m is a positive integer.

When the number of m blocks is greater than 1 and the first and second sets of m blocks of memory cells overlap one another, the MBIST circuitry may copy contents of the first set of m blocks of memory cells to registers prior to testing the first set of m blocks of memory cells, restore contents of a non-overlapping portion of the first set of m blocks of memory cells after testing the first set of m blocks of memory cells, and copy contents of a non-overlapping portion of the second set of m blocks of memory cells to the registers prior to testing the second set of m blocks of memory cells while retaining an overlapping portion of the first set of m blocks of memory cells in the registers.

The MBIST circuitry may include i registers, and m may be configurable from 1 to i.

The number of m blocks may be greater than 1 and the first and second sets of m blocks of memory cells may overlap one another by j blocks of memory cells, where j is a positive integer less than m (j may equal 1 or more, and may be configurable from 1 to m−1).

Each block of memory cells may include n memory cells, where n is a positive integer.

The MBIST circuitry may test successive sets of m blocks of memory cells within a row of the memory cells over multiple test intervals of one or more of the test sessions.

The MBIST circuitry may test successive sets of m blocks of memory cells within a column of the memory cells over multiple test intervals of one or more of the test sessions.

The MBIST circuitry may write segments of a pattern to respective subsets of the memory cells over multiple test intervals of one or more of the test sessions.

The MBIST circuitry may write the segments of the pattern to the respective subsets of the memory cells based on an interleave protocol.

The IC device may include multiple memory systems and a set of one or more registers for each of the memory systems, and MBIST circuitry may test subsets of memory cells of the multiple memory systems in parallel during the test sessions.

Another embodiment is a method that includes precluding functional circuitry from accessing memory cells of a memory system during test sessions, and testing subsets of the memory cells during the test sessions with memory built-in self-test (MBIST) circuitry, where the testing includes storing contents of the subsets of the memory cells in one or more registers prior to testing the respective subsets of the memory cells, and restoring the contents of the subsets of the memory cells from the one or more registers subsequent to testing the respective subsets of the memory cells.

The testing may include testing a first set of m blocks of memory cells during a first test interval of a first one the test sessions and testing a second set of m blocks of memory cells during a second test interval of the first test session, where each block includes one or more memory cells and m is a positive integer.

The first and second sets of m blocks of memory cells may overlap one another, and the method may include copying contents of the first set of m blocks of memory cells to registers prior to testing the first set of m blocks of memory cells, restoring contents of a non-overlapping portion of the first set of m blocks of memory cells from the registers after testing the first set of m blocks of memory cells, and copying contents of a non-overlapping portion of the second set of m blocks of memory cells to the registers prior to testing the second set of m blocks of memory cells while retaining an overlapping portion of the first set of m blocks of memory cells in the registers.

The MBIST circuitry may include i registers and the method may include configuring m from 1 to i.

The method may include writing segments of a pattern to respective subsets of the memory cells over multiple test intervals of one or more of the test sessions.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

DETAILED DESCRIPTION

Figure 1:
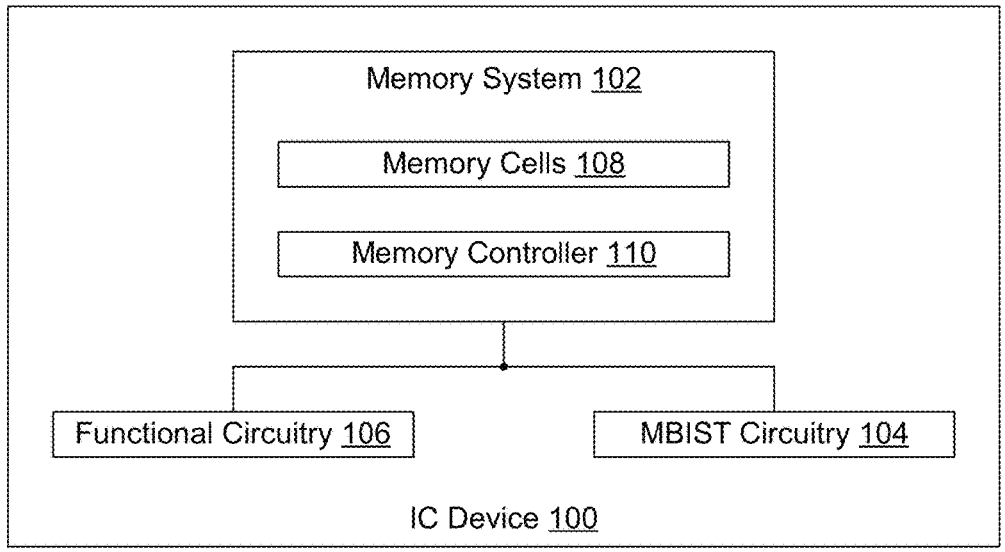
FIG. 1 is a block diagram of an integrated circuit (IC) device 100 that includes a memory system and memory built-in self-test (MBIST) circuitry that performs in-system testing of the memory system, according to an embodiment.

Integrated circuit (IC) based memory may be tested at a time of manufacture or later, referred to herein as production testing and in-field testing, respectively. Production testing may include exhaustive test methods to detect all possible defects/faults. Production testing may use a march-based technique that applies patterns that "march" up and down memory addresses while writing values to and reading values from memory locations.

In-field testing may include a subset of production tests to detect defects/faults that are likely to be encountered over time. In-field testing includes key-on or power-up testing, and in-system testing (i.e., testing memory of an IC device while the IC device is in in-use). During key-on or power-up testing, memory content is typically irrelevant and there is usually sufficient time for relatively extensive testing and remedial actions. Power-on testing may thus include a march-based technique.

In-system testing may utilize online detection and correction techniques for transient faults, and intermittent checks for fixed or permanent faults. Online detection and correction techniques typically use error correction codes. Intermittent checks may be performed with memory built-in self-test (MBIST) circuitry, as disclosed herein.

Intermittent checks present several challenges. One challenge is testing memory cells only when the memory cells are idle. Another challenge is that the available time for a periodic memory test is usually not sufficient to test an entire memory macro. Another challenge is that the content of memory cells under test need to be preserved and not corrupted by the test. Another challenge is that, when an interrupt command is received (e.g., from a central processing unit), the memory test must be stopped. The test may be resumed later when the memory cells are idle.

March-based techniques are generally not appropriate for in-system testing because march-based tests are time-consuming and do not preserve memory contents. March-based techniques would thus unduly interfere with, disrupt, and/or preclude normal operations. Rather, in-system testing may be directed to a subset of possible faults that are considered more likely to be encountered over the system life cycle of a memory device.

Disclosed herein are transparent in-system test solutions that are designed to address the aforementioned challenges. In some aspects, a memory test sequence is segmented, and the segments are performed on subsets or blocks of memory cells during respective test sessions, where each test session may include one or more test intervals.

A distinguishing characteristic of in-system test solutions disclosed herein is that execution is transparent to the memory, meaning that the contents of the blocks of memory cells are stored (e.g., in internal registers) at the outset of the respective test sessions, and restored to the memory cells after testing.

The size of the blocks and/or the number of registers may be variable/configurable, such as to meet a desired or predetermined time interval of the test sessions and/or other factors. Block size and number of registers may be selected to optimize trade-offs between total test time, fault coverage, and MBIST area. For example, larger blocks and greater number of registers may provide a shorter test time and greater fault coverage. Whereas fewer storage registers may reduce MBIST area.

The number of registers may vary from one to the actual number of blocks of memory cells. This flexibility allows customizing MBIST circuitry to test for a desired set of faults. For example, if one register is used, the content of a single block of memory cells can be stored during a test interval, which means that one block can be tested during the test interval. If two registers are used, the contents of two blocks of memory cells may be stored during a test interval, which permits testing for coupling faults between the two blocks. Three or more registers may be useful to test for more complex types of faults.

MBIST techniques disclosed herein may be useful to design a memory test to meet a test time limitation, flexibly schedule test execution to utilize memory idle periods, preserve memory content, and efficiently handle interrupt commands. Additionally, the MBIST techniques disclosed herein may be useful to apply physical data background pattern, such as a physical checkerboard pattern, in segments, during in-system testing, which may be useful for detecting coupling faults.

FIG. 1 is a block diagram of an integrated circuit (IC) device 100 that includes a memory system 102 and memory built-in self-test (MBIST) circuitry 104 that performs in-system testing of memory system 102, according to an embodiment. MBIST circuitry 104 may perform in-system testing on portions of memory system 102 during respective test intervals. MBIST circuitry 104 may perform in-system testing on-demand and/or based on a schedule.

In the example of FIG. 1, memory system 102 includes memory cells 108 and a memory controller 110 to control access to memory cells 108. Memory cells 108 may include non-volatile and/or volatile memory cells, such as random-access memory (RAM) cells, which may include dynamic RAM (DRAM) and/or static RAM (SRAM) cells.

IC device 100 may further include functional circuitry 106 that accesses memory system 102 during normal operations of IC device 100. Functional circuitry 106 may perform a function based on data stored in memory system 102 and/or may generate data to be stored in memory system 102. Alternatively, or additionally, memory system 102 may be accessible to functional circuitry that is external to IC device 100 (i.e., off-chip).

IC device 100 may include one or more features disclosed below with reference to FIG. 2. IC device 100 is not, however, limited to the examples of FIG. 2.

Figure 2:
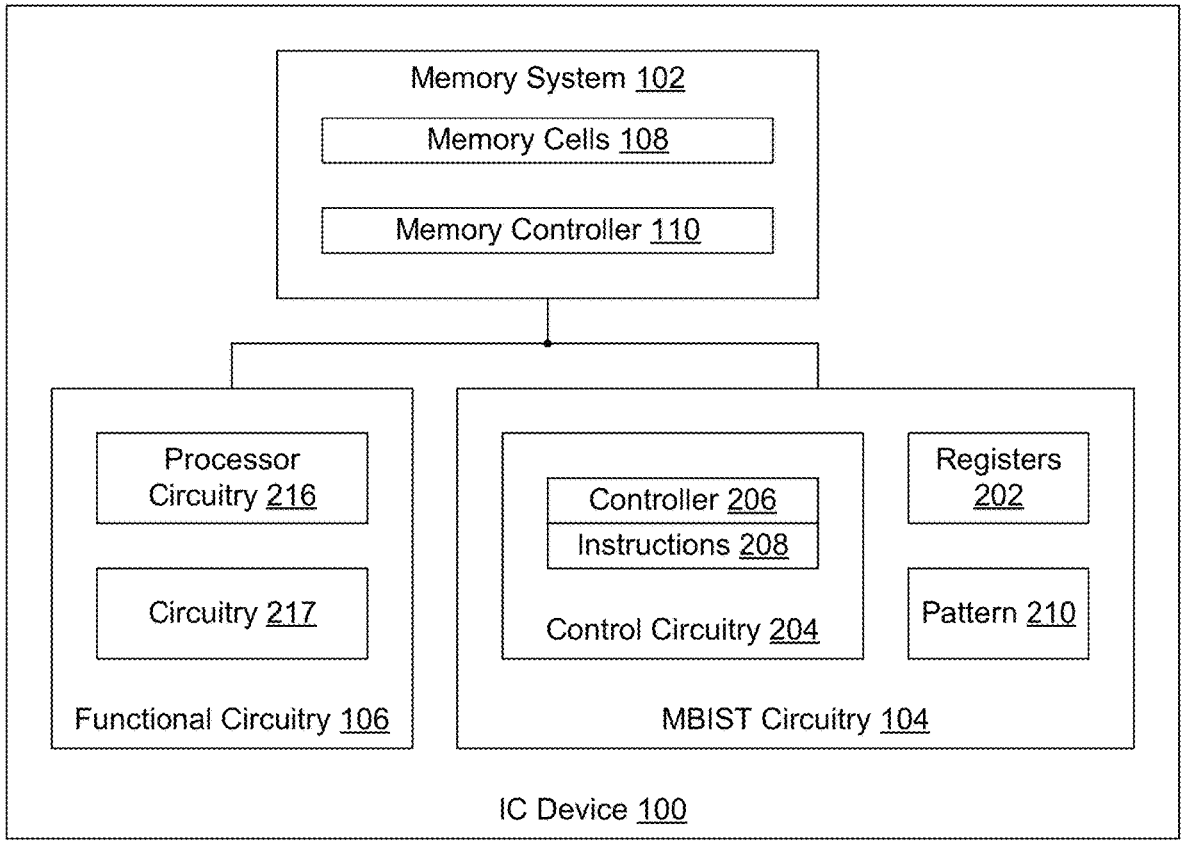
FIG. 2 is a block diagram of the IC device, according to an embodiment.

FIG. 2 is a block diagram of IC device 100, according to an embodiment. In the example of FIG. 2, MBIST circuitry 104 includes local storage or buffers, illustrated here as registers 202, and control circuitry 204. In an embodiment, control circuitry 204 stores content of a subset of memory cells 108 in registers 202, tests the subset of memory cells 108, and restores the content to the subset of memory cells 108 from registers 202 after the testing. Control circuitry 204 may write segments of a pattern 210 to respective blocks or subsets of memory cells 108 (e.g., as part of a write-back test), during respective test intervals. Control circuitry 204 may include a controller 206 and instructions 208 (e.g., firmware-based instructions) that cause controller 212 to perform in-system testing of memory system 102.

In the example of FIG. 2, functional circuitry 106 includes processor circuitry 216, which may execute instructions stored in memory system 102, process data stored in memory system 102, and/or generate data to be stored in memory system 102. In an embodiment processor circuitry 218 invokes MBIST circuitry 104 to perform in-system testing on memory system 102. Alternatively, or additionally, functional circuitry 106 may include circuitry 217 that accesses memory system 102. Circuitry 217 may include fixed function circuitry and/or configurable/programmable circuitry, also referred to as programmable logic (PL).

In an embodiment, IC device 100 includes multiple memory systems, and MBIST circuitry 104 performs in-system testing on the multiple memory systems. In this example, a single set of registers 202 may be shared amongst the multiple memory systems, or a set of registers 202 may be allocated for each memory system. The former may be useful to conserve area of IC device 100. The latter may be useful to reduce test time, such as by testing the multiple memories in parallel.

Figure 3:
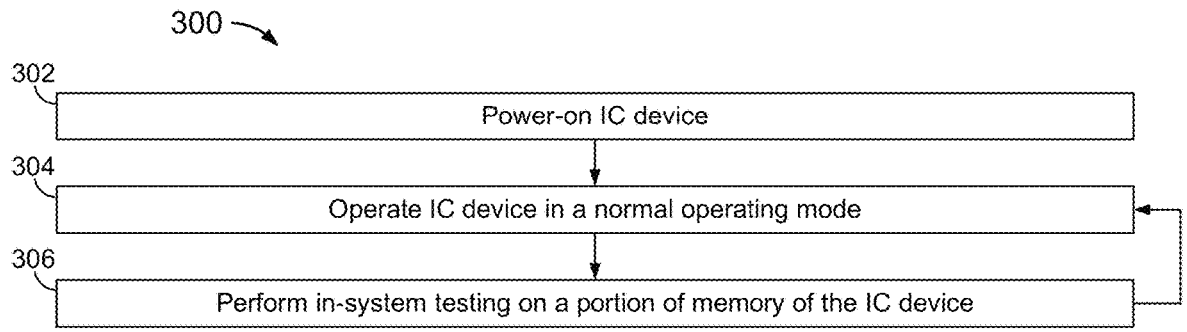
FIG. 3 is a flowchart of a method of performing in-system memory testing, according to an embodiment.

FIG. 3 is a flowchart of a method 300 of performing in-system memory testing, according to an embodiment. Method 300 is described below with reference to IC device 100 for illustrative purposes. Method 300 is not, however, limited to the example of IC device 100.

At 302, IC device 100 is powered on. IC device 100 may perform a power-up self-test on memory system 102 and/or functional circuitry 106.

At 304, IC device 100, or a portion thereof (e.g., functional circuitry 106) operates in a normal operating mode, in which memory cells 108 are accessible to functional circuitry 106 and/or off-chip circuitry.

At 306, MBIST circuitry 104 performs in-system testing on a portion of memory system 102 (i.e., testing subsets of memory cells 108). MBIST circuitry 104 may be invoked by a command or control from functional circuitry 106 (e.g., from processor circuitry 216), from a management system (on-chip or off-chip), and/or from an external device, and/or based on a schedule, a timer, a workload of IC device 100, and/or other factor(s). When in-system testing is invoked, functional circuitry 106 may be precluded from accessing memory system 102, or a portion thereof that is under test. For example, and without limitation, processor circuitry 216 may suspend or intercept memory access requests or interrupts directed to memory system 102 during a test interval.

Upon completion of in-system testing at 306, IC device 100 resumes the normal operating mode at 304. MBIST circuitry 104 may repeatedly cycle between the normal operating mode at 304 and in-system testing at 306 on other portions of memory system 102, as illustrated in FIG. 3. Each iteration of 306 may be referred to herein as a test session. A test session may include one or more test intervals, such as described further below.

MBIST circuitry 104 may record a state of the in-system testing when the normal operating mode is resumed at 304, and may use the recorded state as a starting point when the in-system test is resumed at 306. MBIST circuitry 104 may, for example, retain an indication of a most recent tested subset of memory cells 108 or an indication of a next subset of memory cells 108 to be tested. MBIST circuitry 104 may increment row and/or column counters as testing progresses through memory cells 108, and may use the row and column counts to resume testing.

Figure 4A:
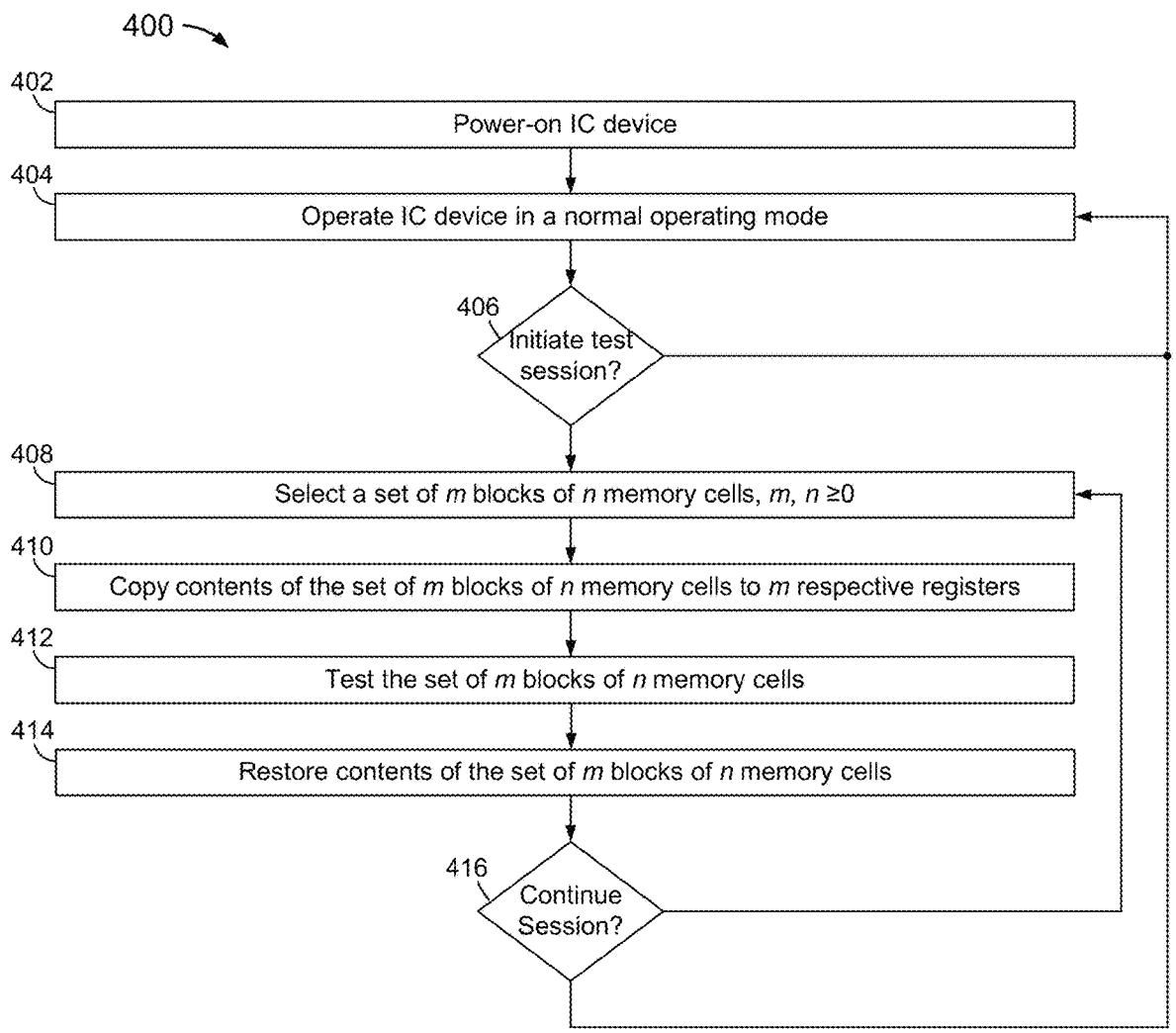
FIG. 4A is a flowchart of another method of performing in-system memory testing, according to an embodiment.

FIG. 4A is a flowchart of a method 400 of performing in-system memory testing, according to an embodiment. Method 400 is described below with reference to IC device 100 for illustrative purposes. Method 400 is not, however, limited to the example of IC device 100.

At 402, IC device 100 is powered on, such as described above with respect to 302 in FIG. 3.

At 404, IC device 100 operates in a normal operating mode, such as described above with respect to 304 in FIG. 3.

At 406, if a test session is initiated (e.g., by functional circuitry 106), processing proceeds to 408, otherwise, IC device 100 remains in the normal operating mode at 404. MBIST circuitry 104 may be invoked to perform in-system testing as described above with respect to 306 in FIG. 3.

At 408, MBIST circuitry 104 selects a set of m blocks of memory cells 108, where each block includes one or more memory cells, and where m is a positive integer. MBIST circuitry 104 may select the set of m blocks of memory cells 108 based on one or more of a variety of schemes or techniques, such as a bit-oriented addressing scheme, a word-oriented addressing scheme, and/or sequential addressing order (e.g., fast column addressing, fast row addressing), non-sequential addressing order, and/or other scheme(s). With fast column addressing, a row address is held constant and a column address is repeatedly incremented until the end of the row is reached. The row address is then incremented and the column address is again repeatedly incremented until the end of the new row is reached. With fast row addressing, the column address is held constant and the row address is repeatedly incremented until the end of the column is reached.

At 410, MBIST circuitry 104 copies contents of the set of m blocks of memory cells 108 to registers 202.

At 412, MBIST circuitry 104 tests the set of m blocks of memory cells 108. MBIST circuitry 104 may test the set of m blocks by writing test data (e.g., a segment of pattern 210) to the set of m blocks, reading contents of the set of m blocks, comparing the data written to the set of m blocks to the data read from the set of m blocks, and evaluating results of the comparison. The results may be evaluated for one or more of a variety of types of faults such as, without limitation, coupling faults, stuck-at faults (SAF), transition faults (TF), stuck-open faults (SOF), address decoder faults (ADF), read destructive faults (RDF), deceptive read destructive faults (DRDF), incorrect read faults (IRF), coupling faults (CFs), Dynamic Read Destructive Faults (dRDF) (e.g., up to 3 operations), and/or Dynamic Deceptive Read Destructive Faults (dDRDF) (e.g., up to 3 operations).

MBIST circuitry 104 may evaluate test results as the results become available, upon completion of one or more test intervals (i.e., iterations of 408-414), upon completion of one or more test sessions, and/or another time. Alternatively or additionally, MBIST circuitry 104 may provide test results to another block of circuitry of IC device 100 and/or to an off-chip device for evaluation. IC device 100 may further include circuitry to accommodate or recover from faults detected from the test results.

MBIST circuitry 104 may utilize a block selection and testing routine, such as:

⇑ (W(CH));

⇑ (R(CH), W(~CH), R(~CH), R(~CH), R(~CH));

⇓ (R(~CH), W(CH), R(CH), R(CH), R(CH)); and

⇓ (R(CH));

where: CH is a physical checkerboard background pattern 210;

~CH is an inverse physical checkerboard background pattern 210;

⇑ is an increasing linear addressing direction; and

⇓ is a decreasing linear addressing direction.

At 414, MBIST circuitry 104 restores the contents of the set of m blocks of memory cells 108 from registers 202.

At 416, if the test session is to continue, processing returns to 408. Otherwise, testing is suspended (i.e., the current test session is terminated), and IC device 100 returns to the normal operating mode at 404. MBIST circuitry 104 may continue testing additional blocks of memory cells until a criterion is met, such as, without limitation, expiration of a predetermined amount of time, completion of testing on a predetermined number of blocks, completion of testing of a predetermined number of segments of pattern 210, or an external criterion, such as a command or interrupt from functional circuitry 106 and/or from an off-chip source (e.g., a management system).

In an embodiment, the number of m blocks within a set is configurable. MBIST circuitry 104 may, for example, have i registers 202, where i is a positive integer, and m may be configurable from 1 to i. As an example, and without limitation, MBIST circuitry 104 may include i=1, 2, 3, 4, or more registers.

The number of m blocks within a set may be based on a criterion, such as a desired duration of test intervals, an overall test time, fault coverage, and/or area consumed by MBIST circuitry 104. For example, increasing m may reduce overall test time and provide broader fault coverage. Whereas decreasing m may reduce area consumed by MBIST circuitry 104. In an embodiment, MBIST circuitry 104 is configurable with respect to number of registers used for testing and number of m blocks within a set.

Each block of m memory cells 108 may include n memory cells 108, where n is a positive integer. In an embodiment, n is configurable. Alternatively, n may be fixed or predetermined (e.g., based on an addressing scheme or architecture of memory system 102).

In an embodiment, MBIST circuitry 104 performs in-system testing on multiple blocks of multiple memory cells 108 (i.e., m>1) and/or on overlapping blocks of multiple memory cells 108. For example, the set of m blocks of memory cells tested at 412 may overlap with a set of m blocks of memory cells tested in a preceding instance of 412 and/or with a set of m blocks of memory cells tested in a subsequent instance of 412. In-system testing on multiple blocks of memory cells 108 and/or overlapping blocks of multiple memory cells 108 may be useful to test for coupling faults amongst adjacent memory cells 108 and/or to test for more complex faults involving three or more memory cells 108. Examples are provided below for various values of m.

Figure 4B:
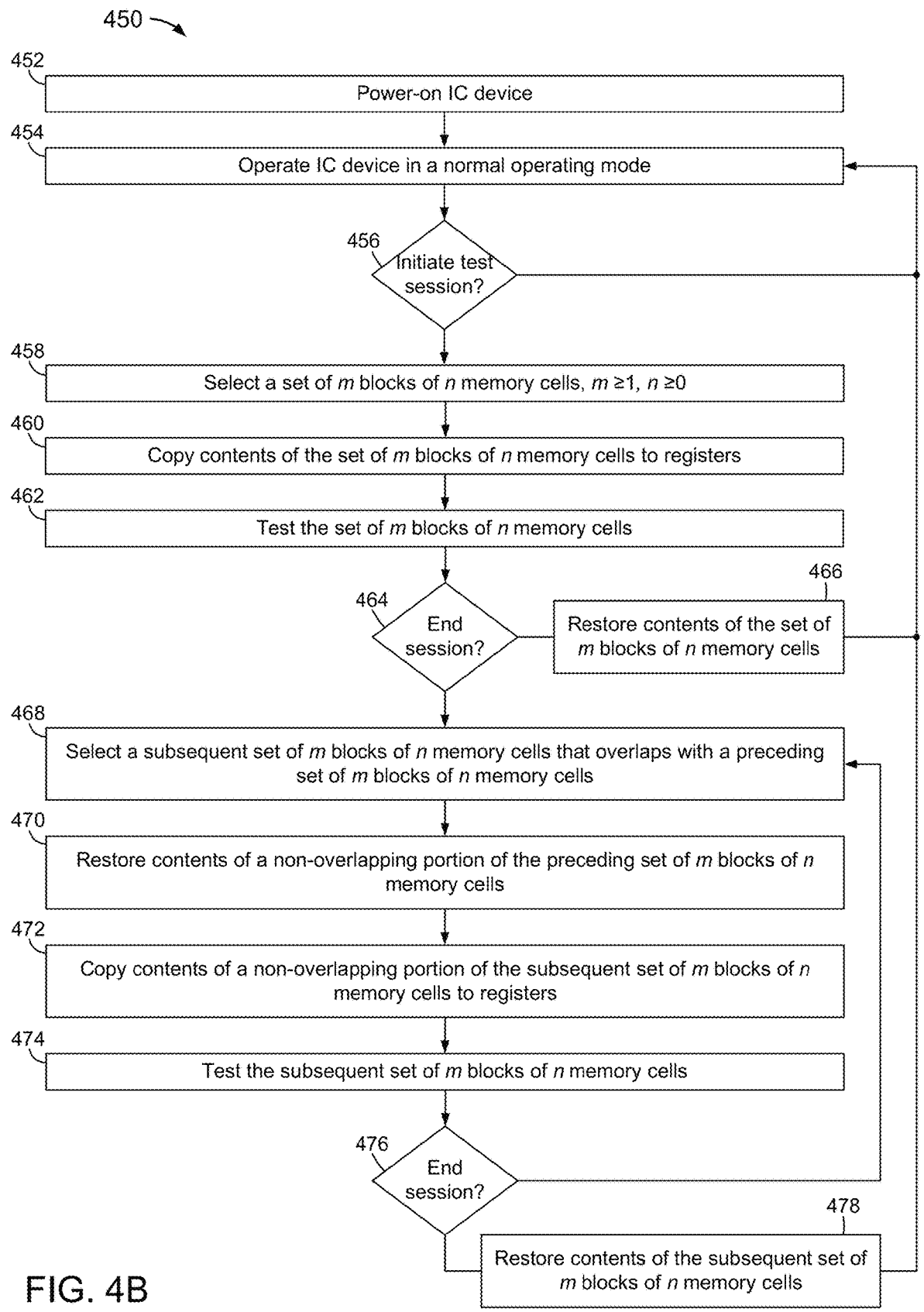
FIG. 4B is a flowchart of a method of performing in-system memory testing on overlapping blocks of memory cells, according to an embodiment.
Figure 5:
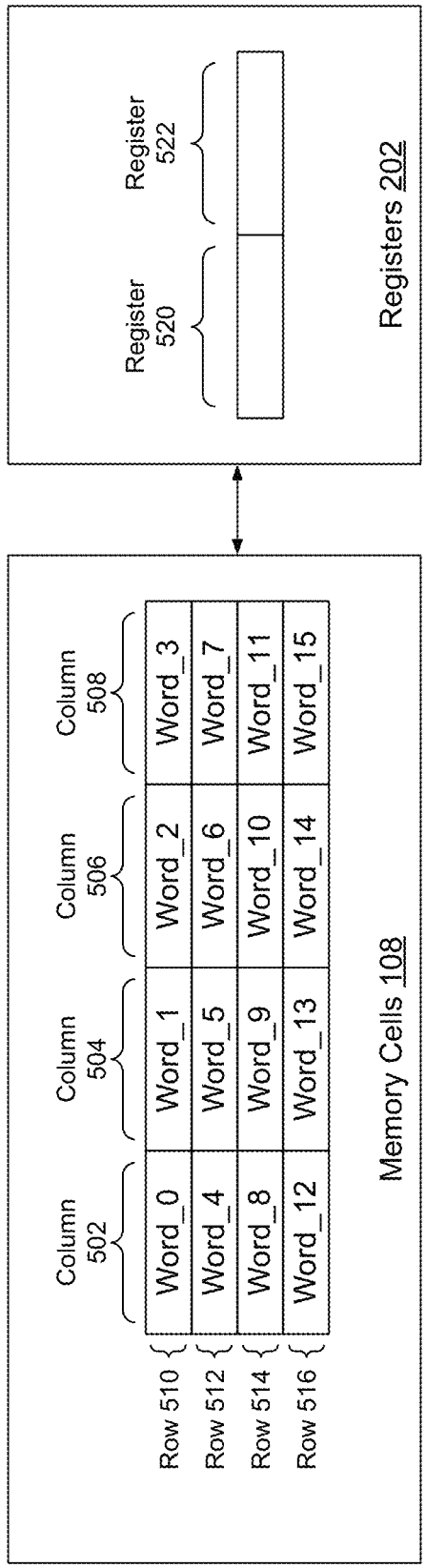
FIG. 5 is a conceptual illustration of memory cells and registers of the IC device, according to an embodiment.

FIG. 4B is a flowchart of a method 450 of performing in-system memory testing on overlapping blocks of memory cells, according to an embodiment. Method 450 is described below with reference to IC device 100 and FIGS. 5-8 for illustrative purposes. Method 450 is not, however, limited to the example of IC device 100 or FIGS. 5-8.

FIGS. 5-8 are a conceptual illustrations of memory cells 108 and registers 202, according to an embodiment. In the examples of FIGS. 5-8, registers 202 include registers 520 and 522 and memory cells 108 include blocks of memory cells arranged in an array of columns 502, 504, 506, and 508, and rows 510, 512, 514, and 516. A first block, at column 502, row 510, contains a Word_0. A second block, at column 504, row 510, contains a Word_1. Each block or word contains one or more memory cells.

At 452, IC device 100 is powered on, such as described above with respect to 402 in FIG. 4A.

At 454, IC device 100 operates in a normal operating mode, such as described above with respect to 404 in FIG. 4A.

At 456, if a test session is initiated (e.g., by functional circuitry 106), processing proceeds to 458, otherwise, IC device 100 remains in the normal operating mode at 454.

Figure 6:
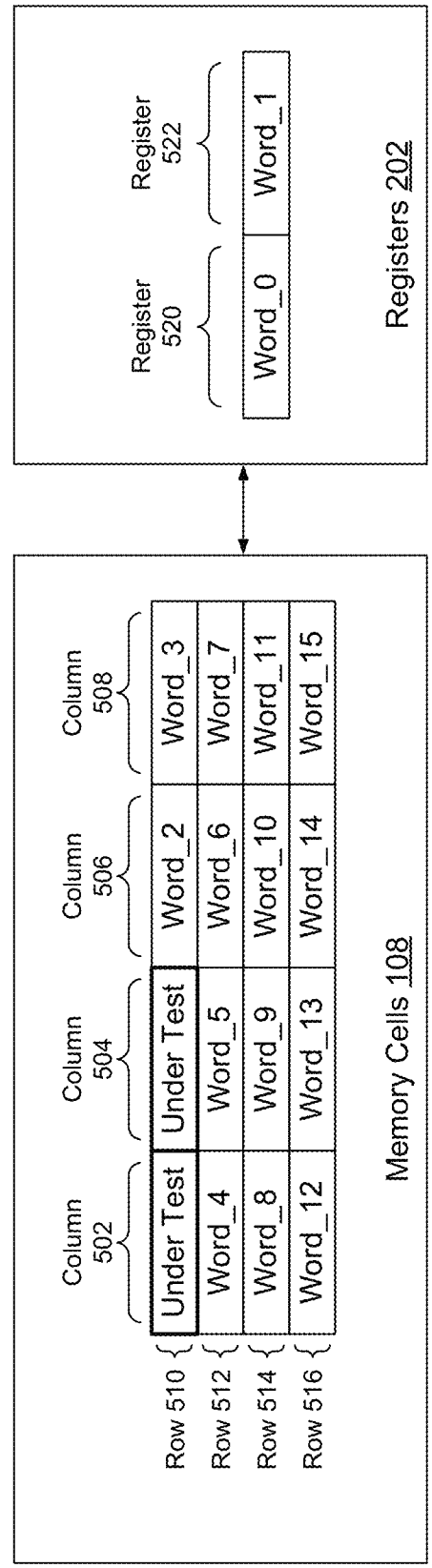
FIGS. 6-8 are a progression of conceptual illustrations of the memory cells and registers of FIG. 5 as the MBIST circuitry copies contents of the memory cells to the registers, tests the memory cells, and restores the contents to the memory cells, according to an embodiment.

At 458, MBIST circuitry 104 selects a set of m blocks of memory cells 108, where m is greater than 1. In FIG. 6, MBIST circuitry 104 selects the blocks at columns 502 and 504 of row 510 as a first set of m blocks of memory cells 108.

At 460, MBIST circuitry 104 copies Word_0 and Word_1 from the blocks at columns 502 and 504 of row 510 to registers 520 and 522, as illustrated in FIG. 6.

At 462, MBIST circuitry 104 tests the blocks at columns 502 and 504 of row 510, as illustrated in FIG. 6.

At 464, if the test session is terminated, MBIST circuitry 104 restores Word_0 and Word_1 from registers 520 and 522 to the respective blocks at column 502 and 504 of row 510, and IC 100 returns to the normal operating mode at 454. Otherwise, processing proceeds to 468.

Figure 7:
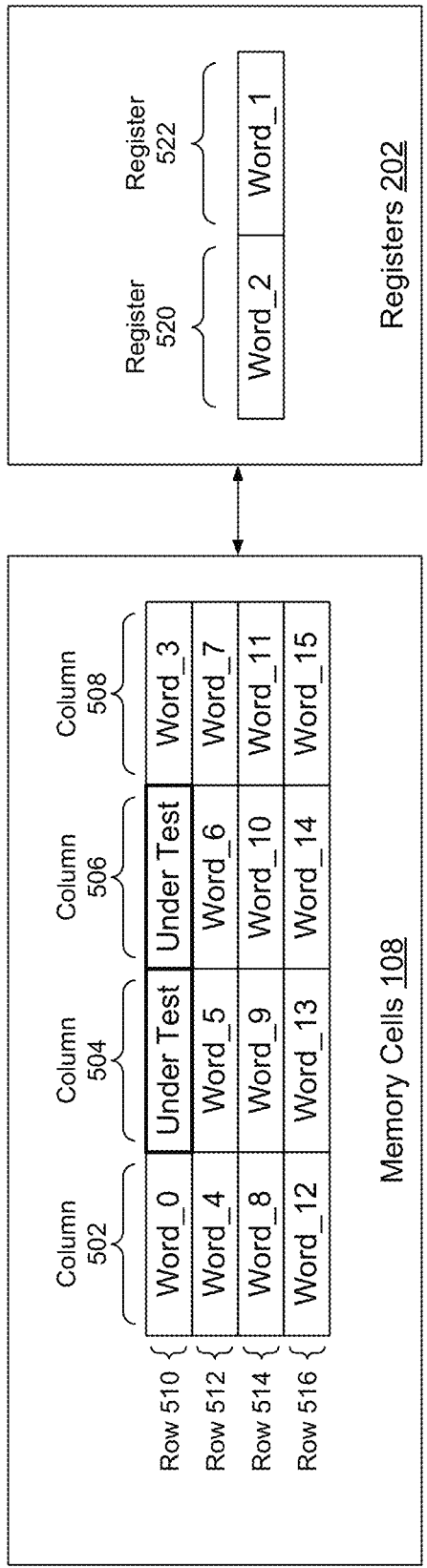

At 468, MBIST circuitry 104 selects a subsequent set of m blocks of memory cells 108 that overlaps with the preceding set of m block of memory cells 108. In FIG. 7, MBIST circuitry 104 selects the blocks at columns 504 and 506 of row 510 as a subsequent set of m blocks of memory cells 108. In this example, the subsequent set of m blocks overlaps the preceding set of m blocks. Specifically, the first set of m blocks and the subsequent set of m blocks each include the block at column 504 containing Word_1.

At 470, MBIST circuitry 104 restores the contents of the non-overlapping portion of the preceding block of m memory cells 108 from registers 202. In FIG. 7, MBIST circuitry 104 restores Word_0 from register 520 to the block at column 502 of row 510.

At 472, MBIST circuitry 104 copies contents of the non-overlapping portion of the subsequent set of m blocks of memory cells 108 to registers 202. In FIG. 7, MBIST circuitry 104 copies Word_2 from the block at column 506 of row 510 to register 520.

At 474, MBIST circuitry 104 tests the blocks at columns 504 and 506 of row 510, as illustrated in FIG. 7.

At 476, if the test session is terminated, processing proceeds to 478 where MBIST circuitry 104 restores Word_1 and Word_2 from registers 202 to the respective blocks at column 504 and 506 of row 510, and IC 100 returns to the normal operating mode at 454. Otherwise, processing returns to 468 for a second subsequent test interval.

Figure 8:
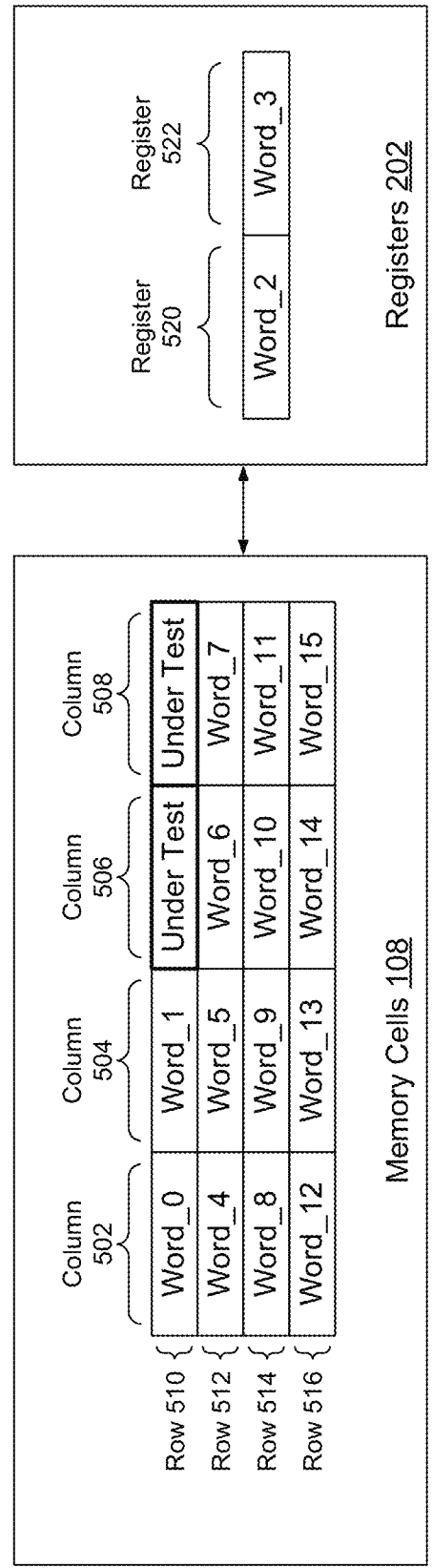

In the second subsequent test interval, MBIST circuitry 104 selects the blocks at columns 506 and 508 of row 510 as a second subsequent set of m blocks of memory cells 108, as illustrated in FIG. 8. In this example, the second subsequent set of m blocks overlaps the preceding set of m blocks. Specifically, the preceding set of m blocks and the second subsequent set of m blocks each include the block at column 506 containing Word_2.

At 470, MBIST circuitry 104 restores the contents of the non-overlapping portion of the preceding block of m memory cells 108 from registers 202. In FIG. 8, MBIST circuitry 104 returns Word_1 from register 522 to the block at column 504 of row 510.

At 472, MBIST circuitry 104 copies contents of the non-overlapping portion of the second subsequent set of m blocks of memory cells 108 to registers 202. In FIG. 8, MBIST circuitry 104 copies Word_3 from the block at column 508 of row 510 to register 522.

At 474, MBIST circuitry 104 tests the blocks at columns 506 and 508 of row 510, as illustrated in FIG. 8.

MBIST circuitry 104 may continue testing additional subsequent blocks of m memory cells until the test session is terminated at 476.

Method 450 may be performed in a similar fashion with respect to rows 512, 514, and 516 (i.e., in respective test intervals of the current test session and/or a subsequent test session(s)). In an embodiment, method 450 is performed across multiple rows (e.g., with respect to Word_3 and Word_4, with respect to Word_7 and Word_8, and with respect to Word_11 and Word_12).

The foregoing examples with reference to FIGS. 5-8 represent an example of fast row addressing. Additionally, or alternatively, method 450 may be performed in an iterative fashion in a fast column addressing mode. For example, during a first test interval (i.e., 458 through 462), in fast column addressing mode and for m=2, MBIST circuitry 104 tests the blocks at rows 510 and 512 of column 502. During a subsequent test interval (i.e., 468-474), MBIST circuitry 104 tests the blocks at rows 512 and 514 of column 502. During a second subsequent test interval, MBIST circuitry 104 tests the blocks at rows 514 and 516 of column 502. MBIST circuitry 104 may test blocks of memory cells 108 within columns 504, 506, and 508 in a similar fashion.

Figure 9:
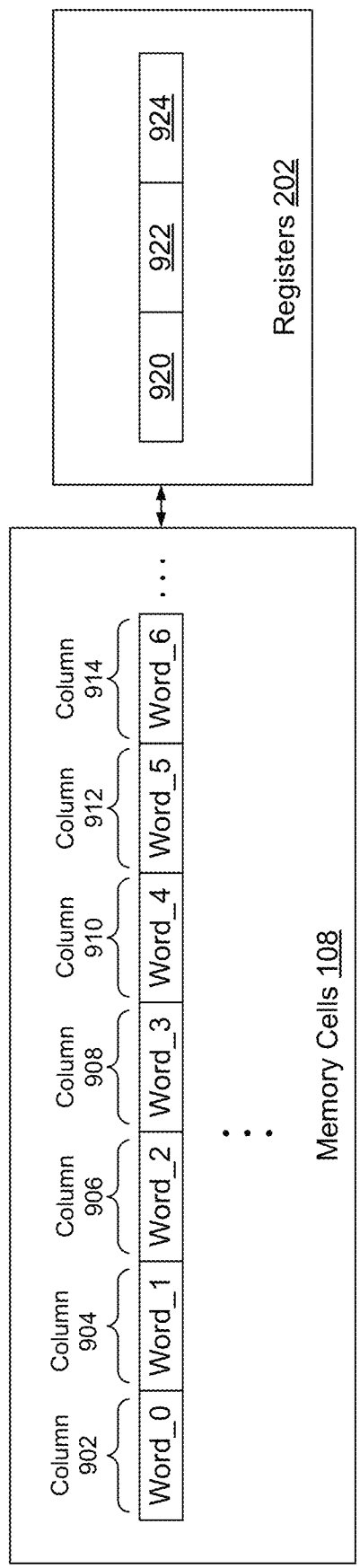
FIG. 9 is another conceptual illustration of the memory cells and registers, according to an embodiment.

Additional examples are provided below with reference to FIG. 9 for m=3. FIG. 9 is a conceptual illustration of memory cells 108 and registers 202, according to an embodiment. In the example of FIG. 9, registers 202 include registers 920, 922, and 924, and memory cells 108 include a row of memory cells containing words stored within respective blocks of the memory cells. Each block/word includes one or more memory cells.

In a first test interval of a first test session, and in fast row addressing mode, MBIST circuitry 104 copies Word_0, Word_1, and Word_2 from blocks at columns 902, 904, and 906 to registers 920, 922, and 924, respectively, and tests the blocks at columns 902, 904, and 906.

In a subsequent test interval of the first test session, MBIST circuitry 104 restores Word_0 and Word_1 from registers 920 and 922 to the blocks at columns 902 and 904, copies Word_3 and Word_4 from the blocks at columns 908 and 910 to registers 920 and 922, and tests the blocks at columns 906, 908, and 910. In this example, the subset of blocks tested in the first test interval and the subset of blocks tested in the subsequent test interval overlap by one block (i.e., the block at column 906 containing Word_2).

Alternatively, in the subsequent test interval of the first test session, MBIST circuitry 104 restores Word_0 from register 920 to the block at column 902, copies Word_3 from the block at column 908 to register 920, and tests the blocks at columns 904, 906, and 908. In this example, the subset of blocks tested in the first test interval and the subset of blocks tested in the subsequent test interval overlap by two blocks (i.e., the blocks at columns 904 and 906 containing Word_1 and Word_2, respectively).

Based on the foregoing description and examples, method 400 and/or method 450 may be performed for one or more other values of m, in fast row addressing mode, fast column addressing mode, and/or other addressing mode(s).

In an embodiment, memory controller 110 accesses memory cells 108 based on an interleaving scheme (e.g., regular or irregular interleaving), and MBIST circuitry 104 writes segments of pattern 210 to blocks of memory cells 108 based on the interleaving scheme to produce a desired or predetermined pattern within memory cells 108. Examples are provided below with reference to FIGS. 10-13 for a checkerboard pattern and regular interleaving.

Figure 10:
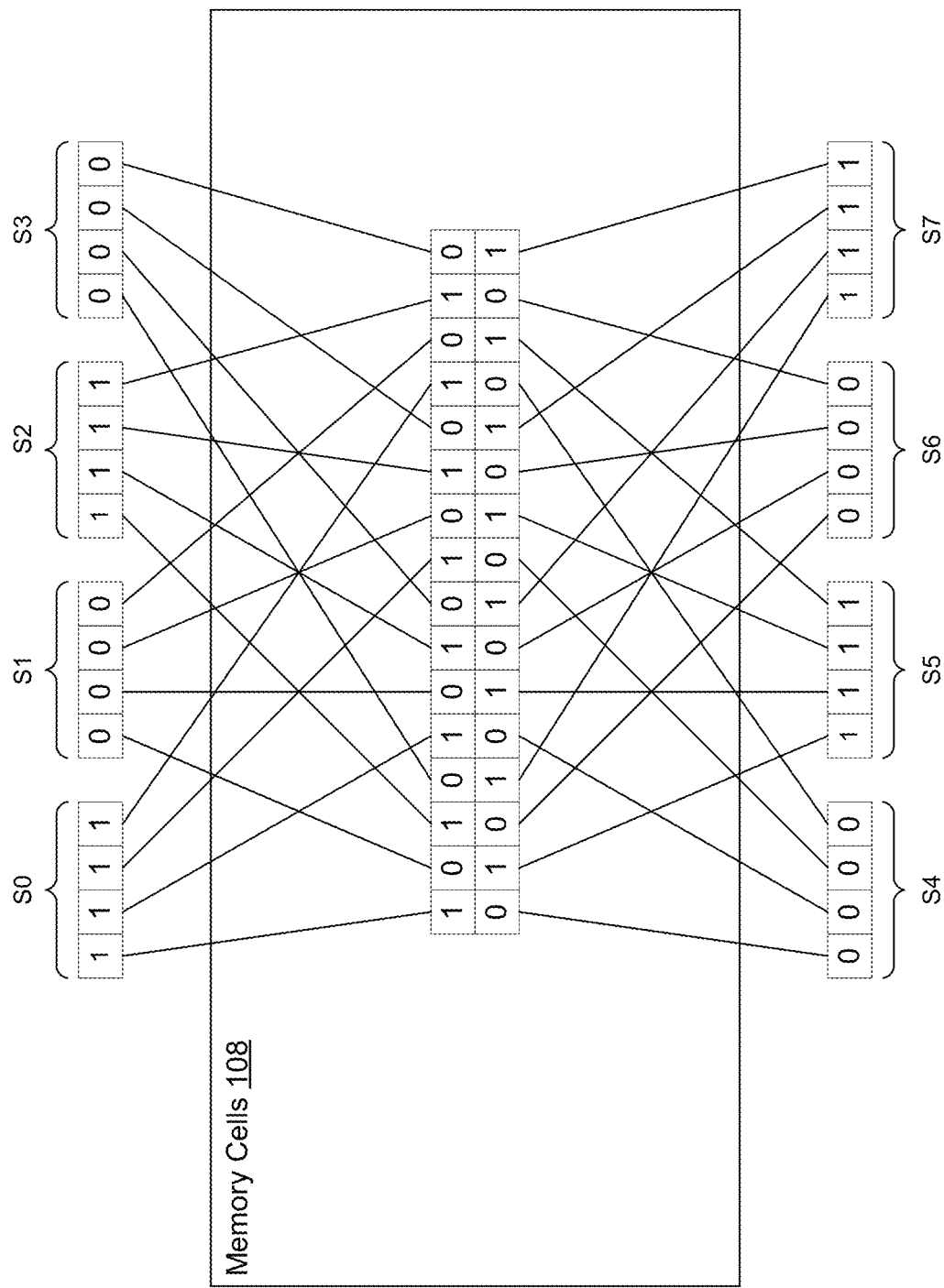
FIG. 10 is a conceptual illustration of segments of a pattern mapped to memory cells of the memory system with regular interleaving, according to an embodiment.

FIG. 10 is a conceptual illustration of segments S0 through S7 of pattern 210 mapped to memory cells 108 with regular interleaving, according to an embodiment. The mappings of FIG. 10 represent the way in which memory controller 110 writes data to (and reads data from) memory cells 108 when configured for regular interleaving. In the example of FIG. 10, segments S0 through S7 are populated with values that form a checkerboard pattern in memory cells 108 (i.e., alternating values amongst adjacent memory cells).

Figure 11:
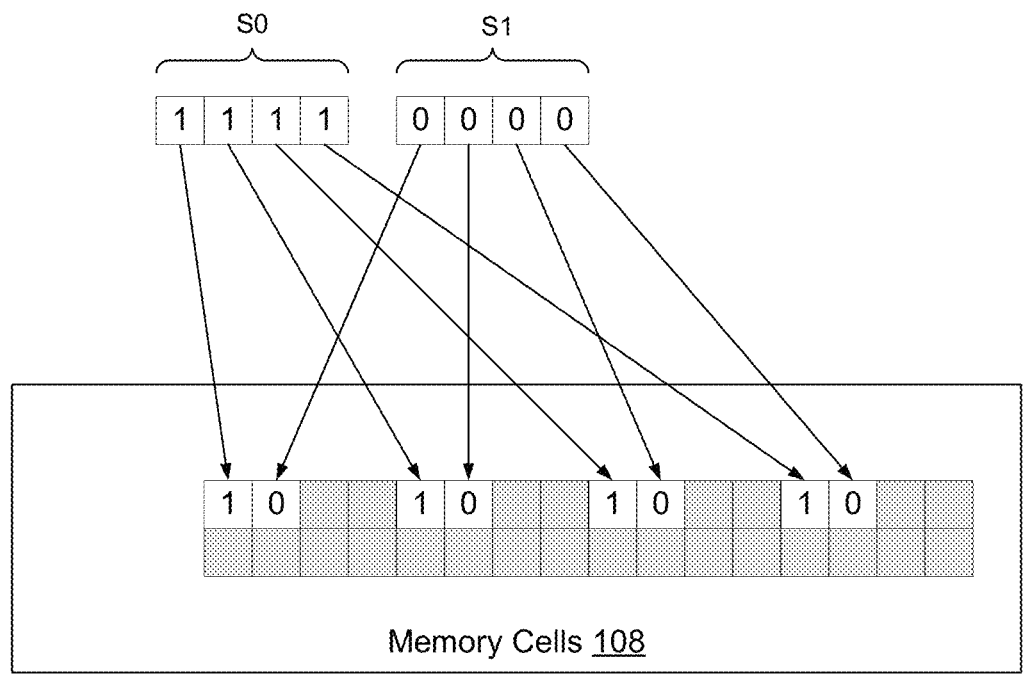
FIGS. 11-13 are a progression of conceptual illustrations of the memory cells of FIG. 10 as the MBIST circuitry writes the segments of the pattern to the memory cells for testing.
Figure 12:
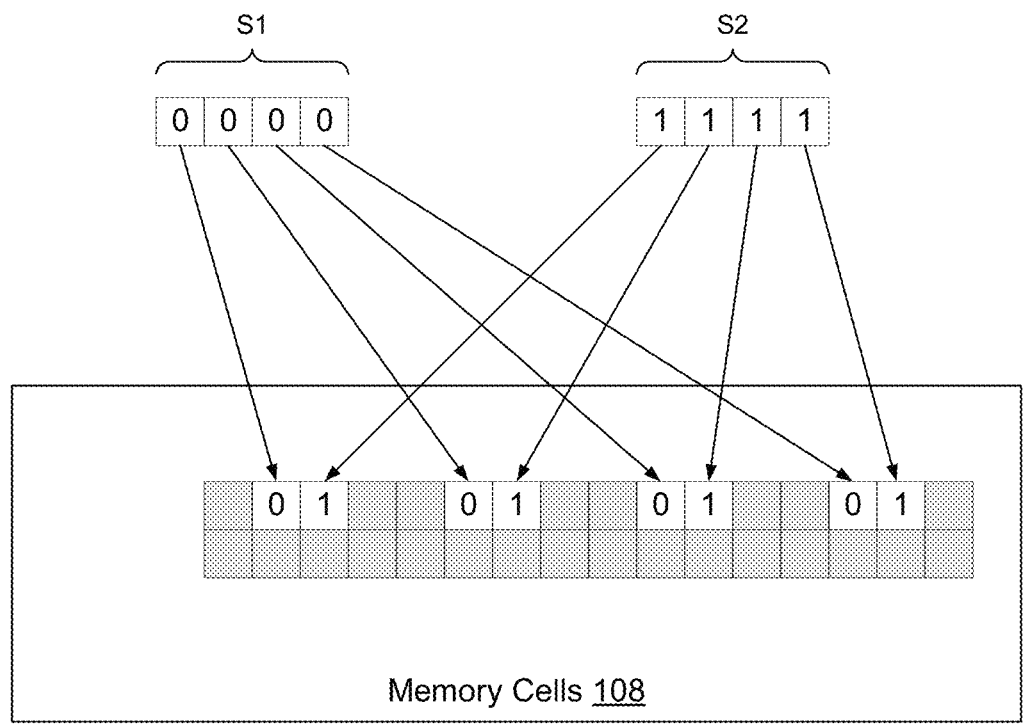
Figure 13:
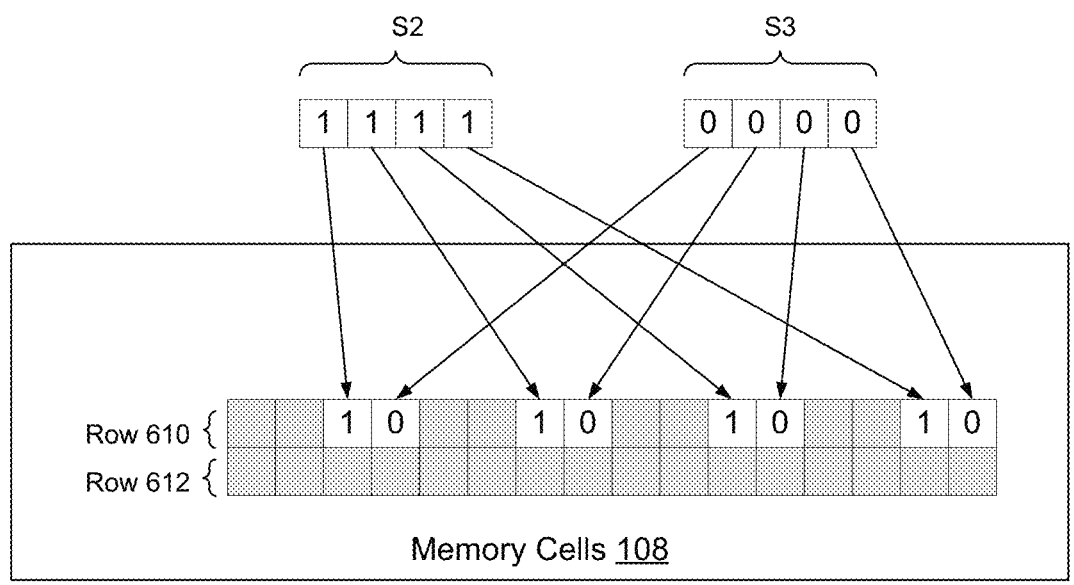

FIGS. 11, 12, and 13 are conceptual illustrations of memory cells 108 as MBIST circuitry 104 writes segments S0 through S3 to memory cells 108 for testing. In FIGS. 11, 12, and 13, memory cells that are not under test are shaded grey. FIGS. 11, 12, and 13 are described below with reference to method 450.

For the examples of FIGS. 10-13, memory system 102 may be configured as follows:
number of words (NW)=16;
number of bits per word (NB)=4;
column multiplexing (CM)=4;
number of rows (NR)=8 (NW/CM);
number of columns (NC)=16 (CM*NB);
regular scrambling; and
regular interleaving.

For m=2, MBIST circuitry 104 writes segments S0 and S1 of pattern 210 to memory cells 108 in a first test interval, as illustrated in FIG. 11. MBIST circuitry 104 writes segments S1 and S2 of pattern 210 to memory cells 108 in a second test interval, as illustrated in FIG. 12. MBIST circuitry 104 writes segments S2 and S3 of pattern 210 to memory cells 108 in a third test interval, as illustrated in FIG. 13. Based on the foregoing description and examples, method 450 may be performed for remaining ones of segments S0 through S7, and/or for one or more other values of m.

Figure 14:
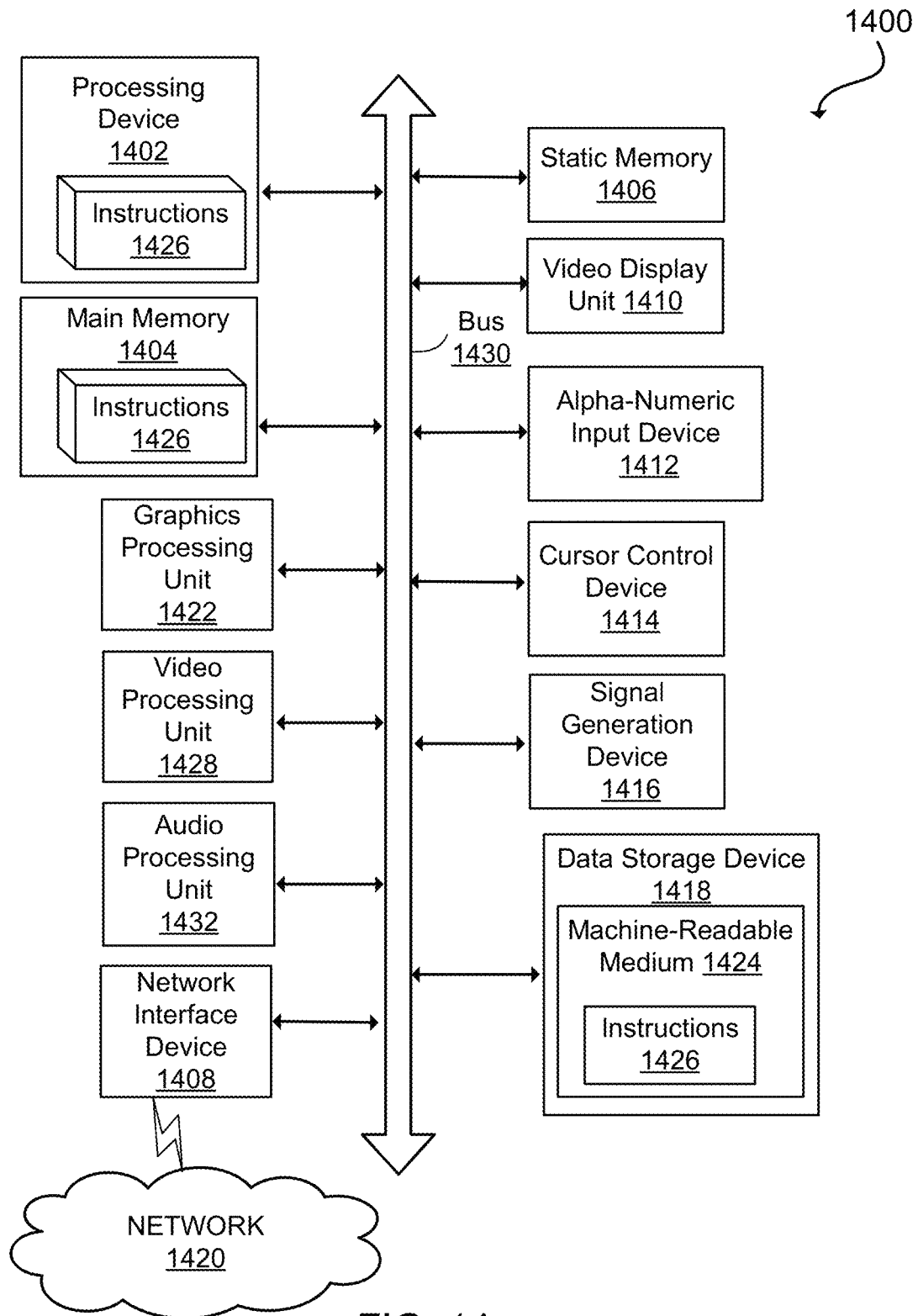
FIG. 14 illustrates an example machine of a computer system within which a set of instructions, for causing the machine to perform any one or more of the methodologies disclosed herein, may be executed.

FIG. 14 illustrates an example machine of a computer system 1400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM), a static memory 1406 (e.g., flash memory, static random access memory (SRAM), etc.), and a data storage device 1418, which communicate with each other via a bus 1430.

Processing device 1402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. The processing device 1402 may be configured to execute instructions 1426 for performing the operations and steps described herein.

The computer system 1400 may further include a network interface device 1408 to communicate over the network 1420. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), a graphics processing unit 1422, a signal generation device 1416 (e.g., a speaker), graphics processing unit 1422, video processing unit 1428, and audio processing unit 1432.

The data storage device 1418 may include a machine-readable storage medium 1424 (also known as a non-transitory computer-readable medium) on which is stored one or more sets of instructions 1426 or software embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting machine-readable storage media.

In some implementations, the instructions 1426 include instructions to implement functionality corresponding to the present disclosure. While the machine-readable storage medium 1424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An integrated circuit (IC) device, comprising:
   a memory system comprising multiple memory cells;
   control circuitry configured to preclude functional circuitry from accessing the memory cells during test sessions;
   one or more registers; and
   memory built-in self-test (MBIST) circuitry configured to test subsets of the memory cells during the test sessions, including to store contents of the subsets of the memory cells in the one or more registers prior to testing the respective subsets of the memory cells, and restore the contents of the subsets of the memory cells from the one or more registers subsequent to testing the respective subsets of the memory cells.

2. The IC device of claim 1, wherein the MBIST circuitry is further configured to:
   test a first set of m blocks of memory cells during a first test interval of a first one of the test sessions; and
   test a second set of m blocks of memory cells during a second test interval of the first test session;
   wherein each block includes one or more memory cells; and
   wherein m is a positive integer.

3. The IC device of claim 2, wherein m>1, the first and second sets of m blocks of memory cells overlap one another, and wherein the MBIST circuitry is further configured to:
   copy contents of the first set of m blocks of memory cells to registers prior to testing the first set of m blocks of memory cells;
   restore contents of a non-overlapping portion of the first set of m blocks of memory cells after testing the first set of m blocks of memory cells; and
   copy contents of a non-overlapping portion of the second set of m blocks of memory cells to the registers prior to testing the second set of m blocks of memory cells while retaining an overlapping portion of the first set of m blocks of memory cells in the registers.

4. The IC device of claim 2, the MBIST circuitry includes i registers, wherein i is a positive integer greater than 1, and wherein m is configurable from 1 to i.

5. The IC device of claim 2, wherein:
   m is greater than 1; and
   the first and second sets of m blocks of memory cells overlap one another by j blocks of memory cells, wherein j is a positive integer, and wherein j is less than m.

6. The IC device of claim 5, wherein j equals 1.

7. The IC device of claim 5, wherein j is configurable from 1 to m−1.

8. The IC device of claim 2, wherein each block of memory cells includes n memory cells, and wherein n is a positive integer.

9. The IC device of claim 8, wherein n is greater than 1.

10. The IC device of claim 2, wherein the MBIST circuitry is further configured to:
    test successive sets of m blocks of memory cells within a row of the memory cells over multiple test intervals of one or more of the test sessions.

11. The IC device of claim 2, wherein the MBIST circuitry is further configured to:
    test successive sets of m blocks of memory cells within a column of the memory cells over multiple test intervals of one or more of the test sessions.

12. The IC device of claim 1, wherein the MBIST circuitry is further configured to:
    write segments of a pattern to respective subsets of the memory cells over multiple test intervals of one or more of the test sessions.

13. The IC device of claim 1, wherein the MBIST circuitry is further configured to:
    write the segments of the pattern to the respective subsets of the memory cells based on an interleave protocol.

14. The IC device of claim 1, further comprising:
    multiple memory systems; and
    a set of one or more registers for each of the memory systems;
    wherein the MBIST circuitry is further configured to test subsets of memory cells of the multiple memory systems in parallel during the test sessions.

15. A method, comprising:
    precluding functional circuitry from accessing memory cells of a memory system during test sessions; and
    testing subsets of the memory cells during the test sessions with memory built-in self-test (MBIST) circuitry, wherein the testing comprises storing contents of the subsets of the memory cells in one or more registers prior to testing the respective subsets of the memory cells, and restoring the contents of the subsets of the memory cells from the one or more registers subsequent to testing the respective subsets of the memory cells.

16. The method of claim 15, wherein the testing further comprises:
    testing a first set of m blocks of memory cells during a first test interval of a first one of the test sessions; and
    testing a second set of m blocks of memory cells during a second test interval of the first test session;
    wherein each block includes one or more memory cells; and
    wherein m is a positive integer.

17. The method of claim 16, wherein the first and second sets of m blocks of memory cells overlap one another, the method further comprising:

copying contents of the first set of m blocks of memory cells to registers prior to testing the first set of m blocks of memory cells;

restoring contents of a non-overlapping portion of the first set of m blocks of memory cells from the registers after testing the first set of m blocks of memory cells; and copying contents of a non-overlapping portion of the second set of m blocks of memory cells to the registers prior to testing the second set of m blocks of memory cells while retaining an overlapping portion of the first set of m blocks of memory cells in the registers.

18. The method of claim 16, wherein the MBIST circuitry includes i registers, and wherein i is a positive integer greater than 1, the method further comprising configuring m from 1 to i.

19. The method of claim 16, wherein m is greater than 1, wherein the first and second sets of m blocks of memory cells overlap one another by j blocks of memory cells, wherein j is a positive integer, and wherein j is less than m.

20. An integrated circuit (IC) device, comprising:
a memory system comprising multiple memory cells;
control circuitry configured to preclude functional circuitry from accessing the memory cells during test sessions;
one or more registers; and
memory built-in self-test (MBIST) circuitry configured to test subsets of the memory cells during the test sessions, including to store contents of the subsets of the memory cells in the one or more registers prior to testing the respective subsets of the memory cells, and restore the contents of the subsets of the memory cells from the one or more registers subsequent to testing the respective subsets of the memory cells;

wherein the MBIST circuitry is further configured to,
test a first set of m blocks of memory cells during a first test interval of a first one of the test sessions, and
test a second set of m blocks of memory cells during a second test interval of the first test session,
wherein each block includes one or more memory cells, and
wherein m is a positive integer;

wherein m>1;

wherein the first and second sets of m blocks of memory cells overlap one another; and wherein the MBIST circuitry is further configured to,
copy contents of the first set of m blocks of memory cells to registers prior to testing the first set of m blocks of memory cells,
restore contents of a non-overlapping portion of the first set of m blocks of memory cells after testing the first set of m blocks of memory cells, and
copy contents of a non-overlapping portion of the second set of m blocks of memory cells to the registers prior to testing the second set of m blocks of memory cells while retaining an overlapping portion of the first set of m blocks of memory cells in the registers.

\* \* \* \* \*